(12) United States Patent
Kronholz et al.

(10) Patent No.: US 8,664,049 B2
(45) Date of Patent: *Mar. 4, 2014

(54) SEMICONDUCTOR ELEMENT FORMED IN A CRYSTALLINE SUBSTRATE MATERIAL AND COMPRISING AN EMBEDDED IN SITU DOPED SEMICONDUCTOR MATERIAL

(75) Inventors: Stephan Kronholz, Dresden (DE); Roman Boschke, Dresden (DE); Vassilios Papageorgiou, Austin, TX (US); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 509 days.

This patent is subject to a terminal disclaimer.

(21) Appl. No.: 12/776,879

(22) Filed: May 10, 2010

(65) Prior Publication Data

US 2010/0289114 A1 Nov. 18, 2010

(30) Foreign Application Priority Data

May 15, 2009 (DE) .................. 10 2009 021 487

(51) Int. Cl.
*H01L 21/00* (2006.01)
*H01L 21/84* (2006.01)

(52) U.S. Cl.
USPC .............. 438/151; 257/355; 257/E29.019; 257/E21.703; 438/414

(58) Field of Classification Search
USPC .............. 438/414, 403; 257/E29.019, E29.02
See application file for complete search history.

(56) References Cited

U.S. PATENT DOCUMENTS

| 6,121,661 A * | 9/2000 | Assaderaghi et al. ........ 257/355 |
| 6,784,042 B2 * | 8/2004 | Salvatore ...................... 438/207 |
| 7,939,415 B2 | 5/2011 | Richter ......................... 438/311 |
| 7,943,442 B2 | 5/2011 | Gehring et al. ............... 438/152 |
| 7,943,471 B1 * | 5/2011 | Buller et al. .................. 438/379 |
| 2002/0022328 A1 * | 2/2002 | Ang et al. ..................... 438/303 |
| 2002/0175378 A1 * | 11/2002 | Choe et al. .................... 257/355 |
| 2004/0173850 A1 * | 9/2004 | Yeo .............................. 257/350 |
| 2006/0043482 A1 | 3/2006 | Burnett et al. ................ 257/344 |
| 2009/0218601 A1 * | 9/2009 | Stephan et al. ............... 257/252 |
| 2010/0327358 A1 * | 12/2010 | Kronholz et al. ............. 257/350 |

FOREIGN PATENT DOCUMENTS

| DE | 102007004859 A1 | 8/2008 | ............ H01L 21/822 |
| DE | 102008007002 A1 | 8/2009 | ............ H01L 21/84 |
| DE | 102008011816 A1 | 9/2009 | ............ H01L 27/06 |

OTHER PUBLICATIONS

Translation of Official Communication from German Patent Office for German Patent Application No. 10 2009 021 487.9 dated Mar. 12, 2010.
Translation of Official Communication from German Patent Office for German Patent Application No. 10 2009 021 487.9 dated Jan. 11, 2013.

* cited by examiner

*Primary Examiner* — Michelle Mandala
*Assistant Examiner* — Shaka White
(74) *Attorney, Agent, or Firm* — Amerson Law Firm, PLLC

(57) ABSTRACT

The PN junction of a substrate diode in a sophisticated SOI device may be formed on the basis of an embedded in situ doped semiconductor material, thereby providing superior diode characteristics. For example, a silicon/germanium semiconductor material may be formed in a cavity in the substrate material, wherein the size and shape of the cavity may be selected so as to avoid undue interaction with metal silicide material.

22 Claims, 11 Drawing Sheets

SEMICONDUCTOR ELEMENT FORMED IN A CRYSTALLINE SUBSTRATE MATERIAL AND COMPRISING AN EMBEDDED IN SITU DOPED SEMICONDUCTOR MATERIAL

BACKGROUND OF THE INVENTION

1. Field of the Invention

Generally, the present disclosure relates to integrated circuits, and, more particularly, to semiconductor elements, such as substrate diodes, of SOI circuits formed in the crystalline material of the substrate.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect makes the reduction of the channel length, and associated therewith the reduction of the channel resistivity, a dominant design criterion for accomplishing an increase in the operating speed of the integrated circuits.

In view of further enhancing performance of transistors, in addition to other advantages, the SOI (semiconductor- or silicon-on-insulator) architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues. Contrary to the body of bulk devices, which is electrically connected to the substrate and thus applying a specified potential to the substrate maintains the bodies of bulk transistors at a specified potential, the body of SOI transistors is not connected to a specified reference potential, and, hence, the body's potential may usually float due to accumulating minority charge carriers, unless appropriate counter measures are taken.

A further issue in high performance devices, such as microprocessors and the like, is an efficient device internal temperature management due to the significant heat generation. Due to the reduced heat dissipation capability of SOI devices caused by the buried insulating layer, the corresponding sensing of the momentary temperature in SOI devices is of particular importance.

Typically, for thermal sensing applications, an appropriate diode structure may be used, wherein the corresponding characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to allow a precise estimation of the temperature conditions within the semiconductor device. In SOI devices, a corresponding diode structure, i.e., the respective PN junction, is frequently formed in the substrate material located below the buried insulating layer, above which is formed the "active" semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures, without undue negative effects on the actual circuit elements.

In other cases, other circuit elements may have to be formed in the crystalline substrate material on the basis of appropriately designed PN junctions, while not unduly contributing to overall process complexity. Hence, the circuit elements to be formed in the substrate material may typically be fabricated with a high degree of compatibility with the usual manufacturing sequence for the circuit elements formed in and above the active semiconductor layer formed on the buried insulating material. For instance, typically, the PN junctions of the circuit elements in the crystalline substrate material may be formed on the basis of implantation processes, which are also performed in the active semiconductor layer for forming deep drain and source regions in order to provide an efficient overall manufacturing flow. In this case, an opening is typically formed so as to extend through the buried insulating layer and into the crystalline substrate material prior to performing the corresponding implantation process. Consequently, the dopant species may be introduced into the crystalline substrate material, i.e., into the portion exposed by the opening, so that corresponding PN junctions may be substantially aligned to the sidewalls of the opening, thereby also providing a certain "overlap" due to the nature of the implantation process and any subsequent anneal processes that may typically be required for activating the dopant species in the drain and source regions of the transistors and also to re-crystallize implantation-induced damage. However, during the further processing of the semiconductor device, for instance by performing appropriate wet chemical etch and cleaning processes, the lateral dimension of the opening may be increased due to an interaction with aggressive wet chemical etch chemistries. The resulting material removal from sidewalls of the opening may also have a significant influence on corresponding PN junctions formed in the crystalline substrate material, as will be described in more detail with reference to FIGS. 1a-1c.

FIG. 1a schematically illustrates a cross-sectional view of a semiconductor device 100 that represents an SOI device. The semiconductor device 100 comprises a substrate 101 which includes, at least in an upper portion thereof, a substantially crystalline substrate material 102, which may be pre-doped in accordance with device requirements. For example, the substrate material 102 may have incorporated therein an appropriate locally restricted concentration of a P-type dopant or an N-type dopant and the like. For example, as illustrated, the crystalline substrate material 102 may comprise an N-well region 102A as may be required for forming circuit elements, such as a substrate diode and the like. Furthermore, a buried silicon dioxide layer 103 is formed on the crystalline substrate material 102, followed by a semiconductor layer 104 that is typically provided in the form of a silicon layer, which, however, may also contain other components, such as germanium, carbon and the like, at least in certain device areas. The semiconductor device 100 comprises a first device region 110 which, in the example shown, may comprise a substrate diode 130 including a PN junction 102P. As previously explained, the substrate diode 130 and, thus, in particular, the PN junction 102P may be used as a temperature monitor for evaluating the temperature of the semiconductor device 100 in a locally resolved manner. Consequently, the electronic characteristics of the PN junction 102P may have a significant influence on the accuracy of a corresponding temperature signal obtained on the basis of the substrate diode 130. The PN junction 102P may be defined by a highly P-doped region 132 embedded in the lightly N-doped well region 102A. Moreover, a highly N-doped region 131 may be provided and may act as a contact area for a cathode of the substrate diode 130. In the manufacturing stage shown in FIG. 1a, openings 103A, 103B may be formed in the buried insulating layer 103 and in the semiconductor layer 104 or a corresponding isolation region 105 provided in the layer 104 so as to laterally delineate the first and second device regions 110, 120.

On the other hand, in the device region 120, one or more transistors 140 may be formed in and above the semiconductor layer 104 in accordance with overall device requirements. In the example shown, a planar transistor configuration is illustrated and comprises a gate electrode structure 141 that may comprise an electrode material 141A, such as a polysilicon material and the like, in combination with a gate dielectric material 141B that separates the electrode material 141A from a channel region 143 positioned in the semiconductor layer 104 laterally between drain and source regions 142. Furthermore, the gate electrode structure 141 may comprise a spacer structure 141C, which may have any appropriate configuration so as to act as an implantation mask during an implantation sequence 106 for introducing the dopant species of the drain and source regions 142.

Typically, the semiconductor device 100 as illustrated in FIG. 1a may be formed on the basis of the following processes. The substrate 101 may be provided so as to include the buried oxide layer 103 formed on the crystalline substrate material 102, while the semiconductor layer 104 is formed on the buried insulating layer 103, which may be accomplished on the basis of well-established wafer bond techniques, sophisticated implantation and oxidation processes and the like. Thereafter, the isolation structure 105 in the form of a shallow trench isolation may be formed by using well-established lithography, etch, deposition and planarization techniques in order to obtain isolation trenches filled with an appropriate dielectric material, such as silicon dioxide. Prior to or after forming the isolation structure 105, the basic dopant concentration of the N-well 102A may be defined, for instance by ion implantation. Next, appropriate materials for the gate electrode structure 141 of the transistor 140 may be provided, for instance, by advanced oxidation and/or deposition techniques for providing the gate dielectric material 141B, followed by the deposition of the gate electrode material 141A, for instance in the form of polysilicon and the like. On the basis of sophisticated lithography and etch techniques, these materials are patterned so as to obtain the gate electrode structure 141. Thereafter, appropriate implantation processes are performed in order to introduce a desired dopant concentration adjacent to the gate electrode structure 141, possibly on the basis of any offset spacer elements (not shown). Subsequently, the sidewall spacer structure 141C is formed by well-established techniques, i.e., by depositing an etch stop material (not shown), such as silicon dioxide followed by the deposition of a silicon nitride material, which is then etched by anisotropic techniques. It should be appreciated that the spacer structure 141C may include two or more individual spacer elements if a corresponding complex dopant profile is required for the drain and source regions 142. According to a well-established process strategy, prior to incorporating the final dopant concentration of the drain and source regions 142, the openings 103A, 103B are formed, which may be accomplished by appropriately covering the second device region 120 by an etch mask, which also defines the desired lateral size and position of the openings 103A, 103B in the first device region 110. Thereafter, an anisotropic etch process is performed, for instance for etching through the semiconductor layer 104 or the isolation structure 105 thereof and etching through the buried insulating layer 103 in order to expose portions of the N-well 102A that correspond to the regions 131, 132, respectively. After the etch process for forming the openings 103A, 103B, the etch mask is removed by any appropriate removal process. It should be appreciated that the etch mask may be provided in the form of a hard mask material in combination with resist materials, depending on the overall process strategy. For instance, polysilicon material may be efficiently used as a hard mask material, which may then be removed on the basis of any appropriate etch technique while still covering the second device region 120, for instance on the basis of a resist mask. Thereafter, the further processing may be continued by performing a sequence of implantation processes. In the example shown, it may be assumed that the transistor 140 represents a P-channel transistor in which the drain and source regions 142 may be formed on the basis of a P-type dopant material during the implantation process 106, in which at the same time the P-type region 132 may be formed in the N-well 102A. For this purpose, an implantation mask 107, such as a resist mask and the like, is provided so as to expose the transistor 140 and the opening 103A while covering the opening 103B. Furthermore, in the example shown, a corresponding implantation process may have been performed prior to the process 106 by using an appropriate mask for covering the opening 103A and the transistor 140 while exposing any N-channel transistors (not shown) and the opening 103B, which may thus be used as an implantation mask for forming the N-doped region 131 together with drain and source regions of the exposed N-channel transistors. In other cases, the N-doped region 131 and corresponding drain and source regions of N-channel transistors may be formed after the implantation process 106.

Consequently, the dopant concentration of the region 132 substantially corresponds to the dopant concentration of deep drain and source areas of the region 142 of the transistor 140. For this reason, the characteristics of the PN junction 102P may be determined by process conditions required for obtaining a desired dopant profile for the drain and source regions 142 of the transistor 140. Thereafter, typically, appropriately designed anneal processes are performed in order to activate the dopant species and also re-crystallize implantation-induced damage. Due to the nature of the implantation process 106 and due to the subsequent anneal processes, the PN junction 102P may be driven "outwardly," as indicated by the dashed line 102F, so that a certain degree of overlap between the layer 103 and the highly doped region 132 is obtained depending on the process parameters of the previously performed process sequence. Hence, the magnitude of the resulting overlap may be substantially determined by the process parameters, which are typically selected so as to obtain superior characteristics of the drain and source regions 142, in particular when extremely scaled transistor devices are considered. For example, in sophisticated planar transistor configurations, a gate length, i.e., in FIG. 1a, the horizontal extension of the electrode material 141A, may be approximately 50 nm and less, thereby also requiring precisely defined characteristics of the drain and source regions 142. For example, a pronounced dopant diffusion in the drain and source regions 142 may typically be avoided in order to obtain a desired steep dopant gradient for the drain and source regions 142.

Thereafter, the further processing is continued by performing further manufacturing steps as are required for completing the basic transistor configuration in the device region 120. In particular, one or more sophisticated wet chemical cleaning or etch processes have to be performed in order to prepare exposed surface portions of the device 100 for forming a metal silicide in the drain and source regions 142 and possibly in the gate electrode structure 141, thereby also forming corresponding metal silicide areas in the regions 131, 132. Typically, the provision of a metal silicide may be required for reducing the overall contact resistivity of the transistor 140 and also of the diode 130.

FIG. 1b schematically illustrates the semiconductor device 100 during a wet chemical etch process 108 which is typically designed to remove oxide from exposed silicon surfaces in order to provide enhanced surface conditions during the subsequent silicidation process. Consequently, during the wet chemical process 108, exposed sidewall portions 103S of at least the buried insulating layer 103 in the openings 103A, 103B may also be attacked, thereby causing a certain degree of material removal. In the example shown, sidewall portion 104S of the isolation structure 105 may suffer from a certain degree of material removal. Consequently, the sidewalls 103S, 104S of the openings 103A, 103B, which may act as an implantation mask during the implantation process 106 (FIG. 1a), may now expose a more or less pronounced portion of the doped regions 131, 132, as indicated by the dashed lines. The increase of at least the opening 103A does have an influence on the finally obtained characteristics of the PN junction 102P after the formation of a metal silicide material.

FIG. 1c schematically illustrates the semiconductor device 100 in a further advanced manufacturing stage in which metal silicide regions 144 are formed in the transistor 140 and metal silicide regions 134 are formed in the doped regions 132, 131 of the substrate diode 130. Due to the preceding material removal at the sidewalls 103S, the metal silicide 134 may extend towards the PN junction 102P and may even result in a short circuit at critical regions 102C, thereby resulting in a complete failure of the substrate diode 130. Even if the metal silicide 134 does not extend across the PN junction 102P in the critical areas 102C, a significant modification of the junction characteristics may result due to the reduced lateral size of the junction region 102P. This may particularly influence the electronic characteristics of sophisticated PN junctions formed in accordance with a process sequence as described above when very sophisticated transistor elements are considered. As a consequence, a more or less modified behavior of the diode characteristic of the substrate diode 130 may result, thereby significantly reducing the reliability of any information obtained on the basis of the substrate diode 130.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which superior PN junctions may be formed in the crystalline substrate material of SOI devices, for instance for substrate diodes, without requiring specifically designed implantation processes in order to account for undesired material removal to form metal silicide regions. For this purpose, the PN junction of interest in the crystalline substrate material may be formed on the basis of a cavity that may at least be partially filled with a doped semiconductor material. Consequently, the characteristics of the resulting PN junction may be adjusted on the basis of appropriately dimensioning and shaping the corresponding cavity and selecting appropriate process parameters for the deposition process, for instance a selective epitaxial growth process, in order to incorporate a desired concentration of a dopant species. In some illustrative aspects disclosed herein, the resulting junction characteristics and thus the electronic behavior of a substrate diode may further be adjusted by appropriately selecting the basic material composition of the in situ doped semiconductor material so as to reduce leakage currents and thus provide a superior diode characteristic. For instance, a silicon/germanium alloy may be provided as an in situ doped material in order to obtain a low leakage diode and a reduced voltage drop. Consequently, according to the principles disclosed herein, the PN junction may be positioned at any appropriate lateral position in order to avoid undue interaction of the PN junction during a subsequent silicidation process, which may be otherwise caused in conventional strategies in which the PN junction may be defined by ion implantation through a corresponding opening in the dielectric material. A desired degree of overlap in the highly doped region to be formed on the basis of the doped semiconductor material and the buried insulating layer may be obtained by applying isotropic etch techniques, wherein the degree of under-etching of the dielectric material may thus provide a desired high degree of process margin during the subsequent silicidation process.

One illustrative method disclosed herein relates to forming a semiconductor device. The method comprises forming an opening through a buried insulating layer of the semiconductor device so as to expose a portion of a crystalline material of a substrate of the semiconductor device. The method additionally comprises forming a cavity in a portion of the crystalline material through the opening, wherein the cavity has a greater lateral extension relative to the opening. The method further comprises forming a semiconductor material in the cavity, wherein at least a portion of the semiconductor material comprises a dopant species so as to form a PN junction with the crystalline material. Finally, a metal silicide is formed on the basis of the semiconductor material.

A further illustrative method disclosed herein relates to forming a substrate diode of a semiconductor device. The method comprises forming an opening in a dielectric material formed on a crystalline substrate material of the semiconductor device. The method additionally comprises forming a cavity in the crystalline substrate material through the opening and filling at least a portion of the cavity with a doped semiconductor material. Finally, a metal silicide is formed so as to electrically connect to the doped semiconductor material.

One illustrative semiconductor device disclosed herein comprises a first doped region laterally embedded in a crystalline substrate material and comprising a semiconductor alloy. A second doped region is formed in the crystalline substrate material, wherein the first and second doped regions form a PN junction of a substrate diode. The semiconductor device further comprises a metal silicide formed in a portion of the first doped region and a buried insulating layer that is formed on the crystalline substrate material, wherein the buried insulating layer comprises an opening extending to the metal silicide.

BRIEF DESCRIPTION OF THE DRAWINGS

The disclosure may be understood by reference to the following description taken in conjunction with the accompanying drawings, in which like reference numerals identify like elements, and in which.

Figure 1A:
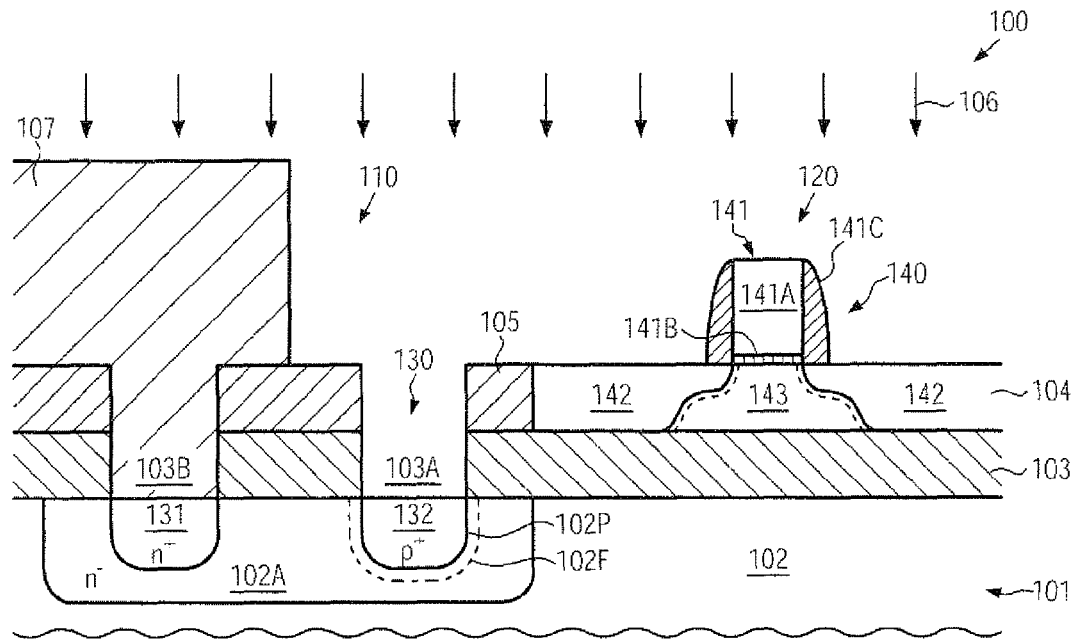
FIGS. 1a-1c schematically illustrate cross-sectional views of a conventional SOI device during various manufacturing stages in forming a substrate diode in a crystalline substrate material together with drain and source regions of transistor elements on the basis of conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques and semiconductor devices in which the PN junction of a circuit element, that is, in one illustrative embodiment, a substrate diode may be formed on the basis of an in situ doped semiconductor material that may be filled into an appropriately shaped and dimensioned cavity in the substrate material. In this manner, the characteristics of the PN junction of the substrate diode may be provided in a highly predictable manner substantially without being affected by a pronounced material removal caused by wet chemical etch and cleaning recipes to be performed prior to actually forming a metal silicide. In other words, by providing a cavity in the substrate material at the bottom of a corresponding opening formed in the trench isolation or semiconductor material, a desired lateral offset of a PN junction may be selected on the basis of process parameters of the etch process for forming the cavity. Thus, by selecting an appropriate lateral etch rate during the cavity etch process, a sufficiently great distance between a metal silicide and a PN junction may be achieved, thereby obtaining superior robustness of the PN junction characteristics in view of corresponding undesired material removal prior to actually forming the metal silicide, as is previously discussed with reference to FIGS. 1a-1c. In addition to reducing device variability, other electronic characteristics of the resulting PN junction may be adjusted by using an appropriate in situ doped semiconductor material, such as a semiconductor alloy for silicon-based devices, in order to provide the desired diode behavior. In some illustrative embodiments, the in situ doped semiconductor material may be provided in the form of a silicon/germanium alloy, which may generally result in a reduced diode leakage and a reduced forward voltage drop compared to conventional silicon diodes. In other cases, other appropriate semiconductor materials, such as silicon carbide and the like, may be used in combination with a desired in situ doping in order to specifically design the characteristics of the resulting substrate diode. In some illustrative embodiments, the manufacturing sequence for providing the in situ doped semiconductor material for the substrate diode may be performed independently from the manufacturing sequence for forming transistor elements, thereby obtaining a high degree of flexibility in specifically adjusting transistor characteristics without influencing the desired diode characteristic. For this purpose, the process of forming a cavity in the substrate material and filling the same with the in situ doped semiconductor material may be performed at any appropriate stage of the overall manufacturing flow. In this case, well-established process techniques may be used, for instance selective epitaxial growth recipes which may frequently be employed for providing an embedded strain-inducing semiconductor material in sophisticated semiconductor devices. Hence, in this case, available resources and manufacturing strategies may be efficiently used for forming the substrate diode, thereby not unduly contributing to overall process complexity.

In other illustrative embodiments disclosed herein, the process of forming the PN junction of substrate diodes may be performed with a high degree of compatibility with the manufacturing sequence for forming a semiconductor alloy in drain and source regions of transistor elements, thereby providing a very efficient manufacturing flow while nevertheless achieving significantly enhanced characteristics of the resulting substrate diodes.

Irrespective of the manufacturing strategy, in some illustrative embodiments, the in situ doped semiconductor material may receive an appropriately designed cap layer so as to further enhance further processing, for instance in view of forming a metal silicide. That is, a cap layer may be provided with an appropriate material composition so as to obtain a desired stable metal silicide, for instance by adapting the silicon concentration in the cap material and the like. In this case, the semiconductor material may have superior characteristics with respect to the substrate diode and may also provide enhanced conditions during the silicidation formation by appropriately selecting the composition of the cap material.

Figure 1B:
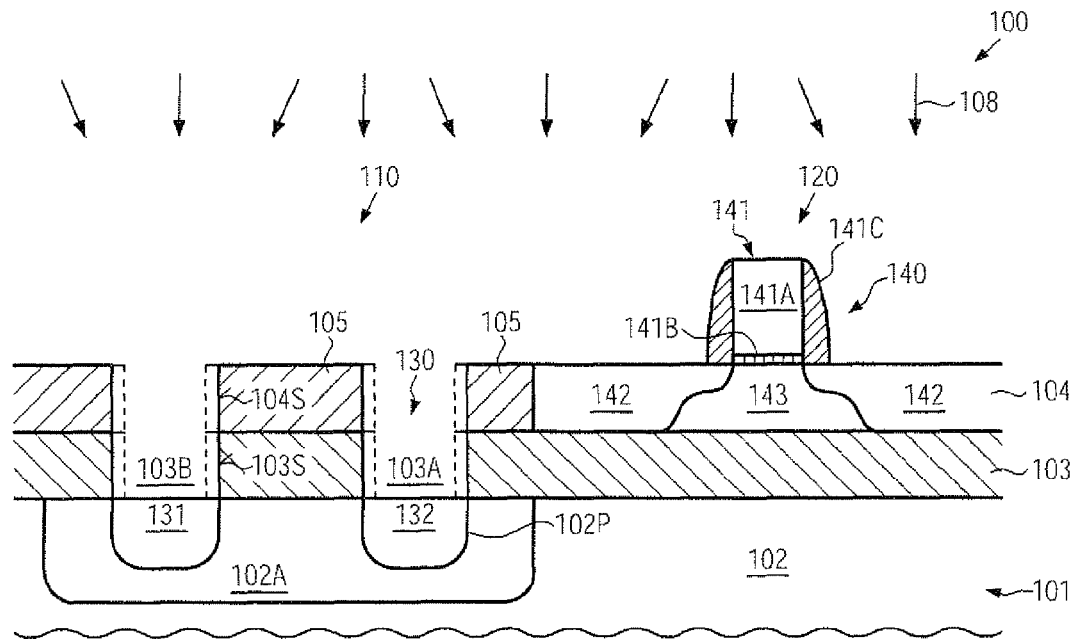
Figure 1C:
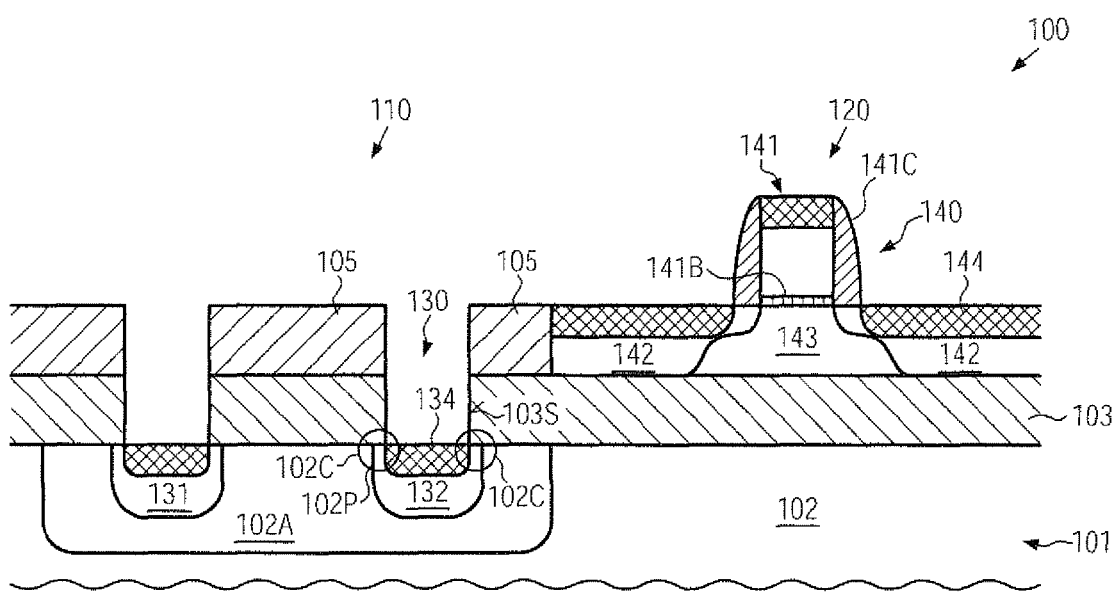
Figure 2A:
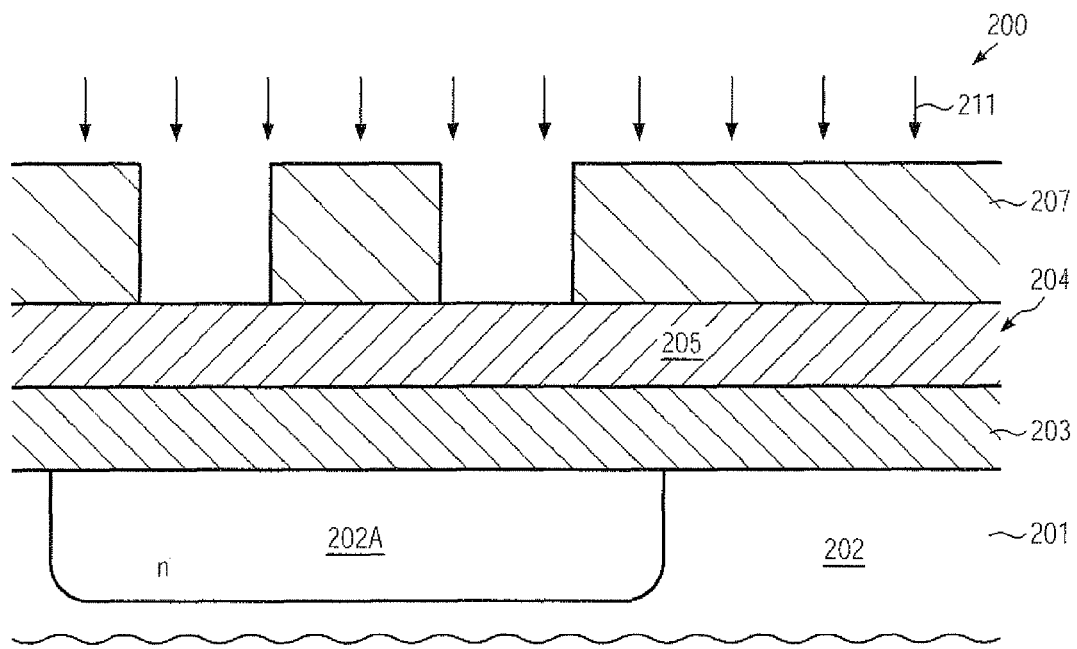
FIGS. 2a-2g schematically illustrate cross-sectional views of a semiconductor device during various manufacturing stages when forming a substrate diode according to illustrative embodiments, wherein the PN junction is provided on the basis of an etch process followed by a selective epitaxial growth technique.
Figure 2B:
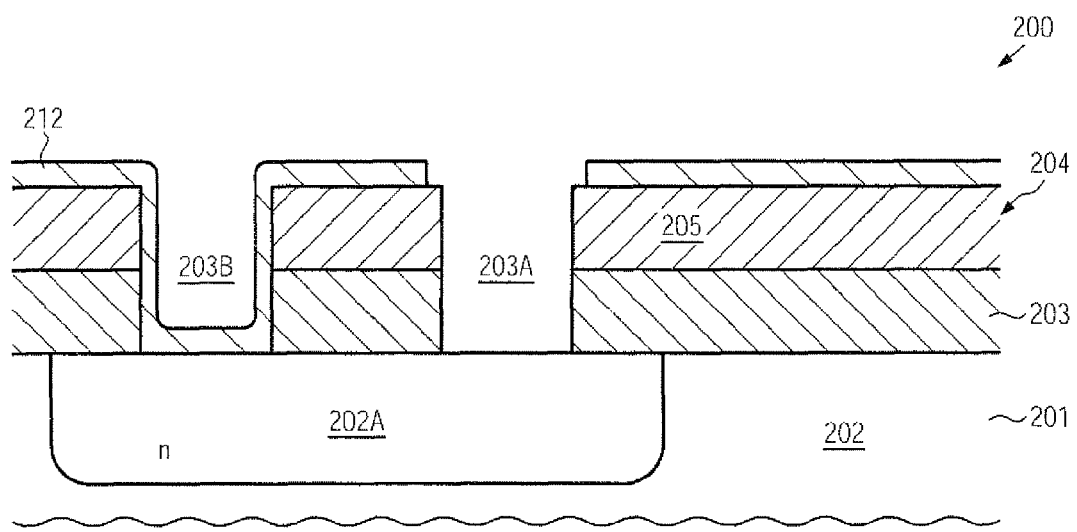
Figure 2C:
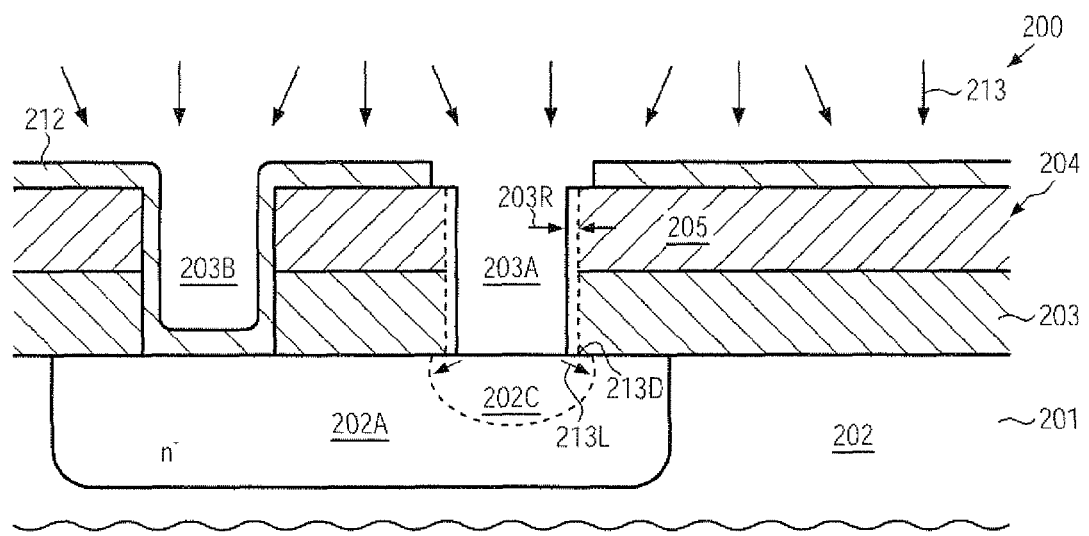
Figure 2D:
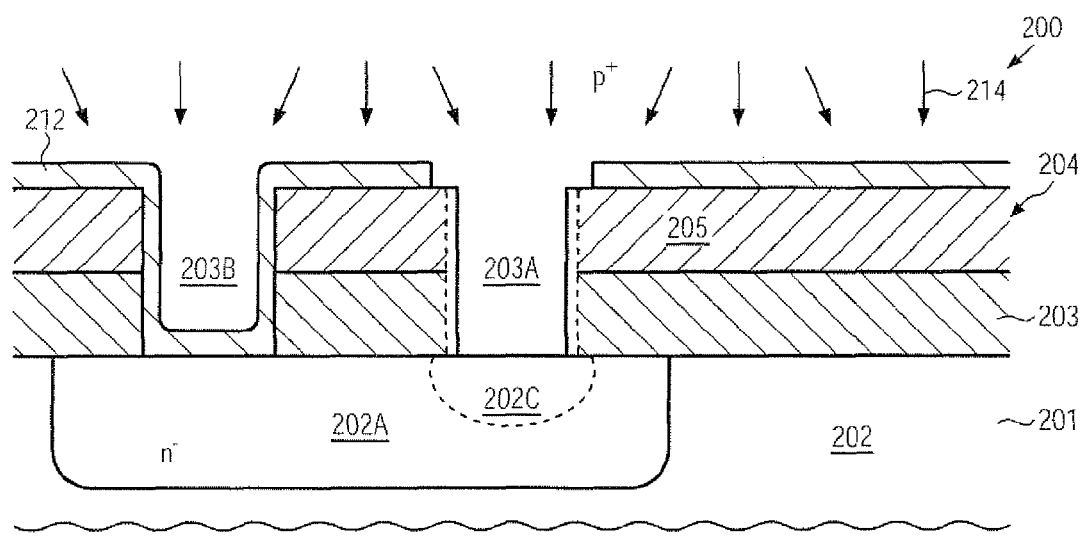
Figure 2E:
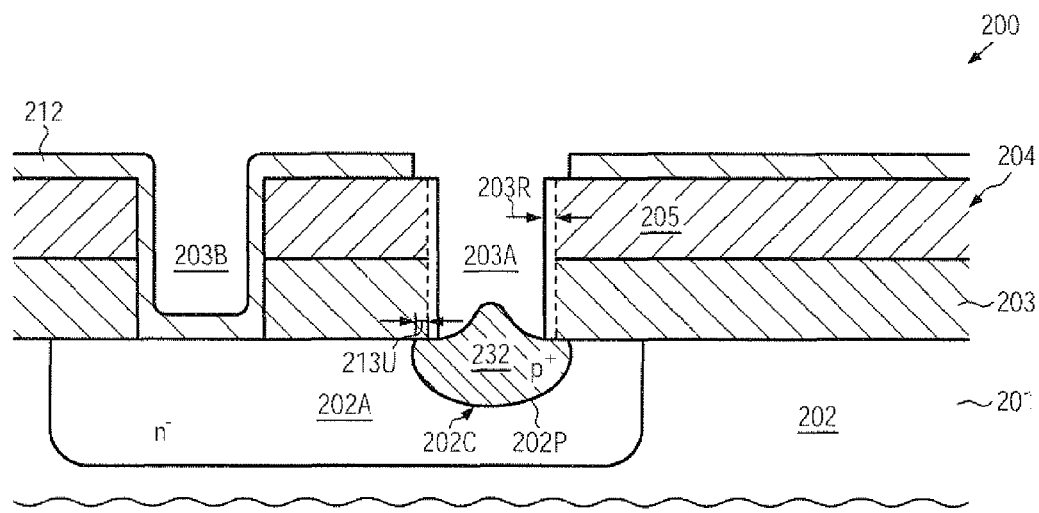
Figure 2F:
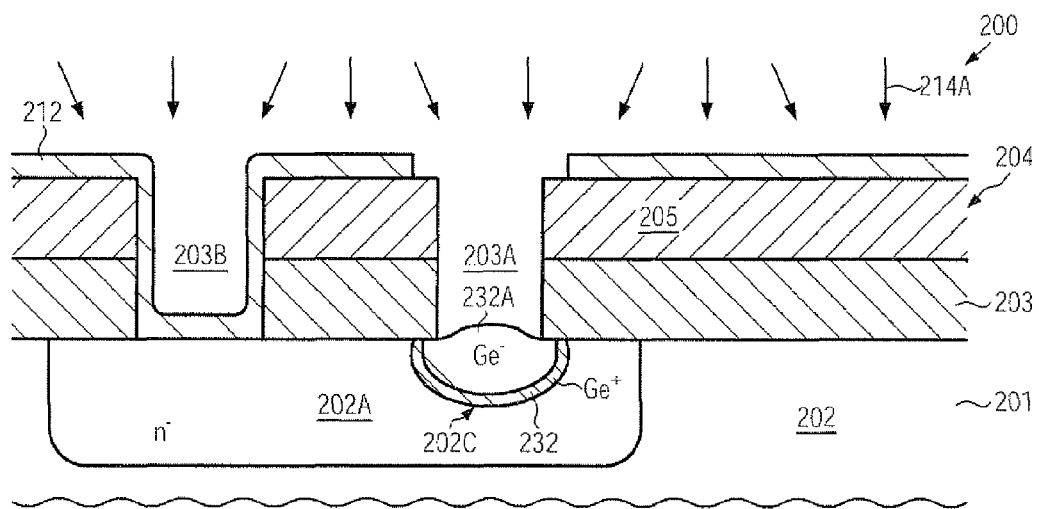
Figure 2G:
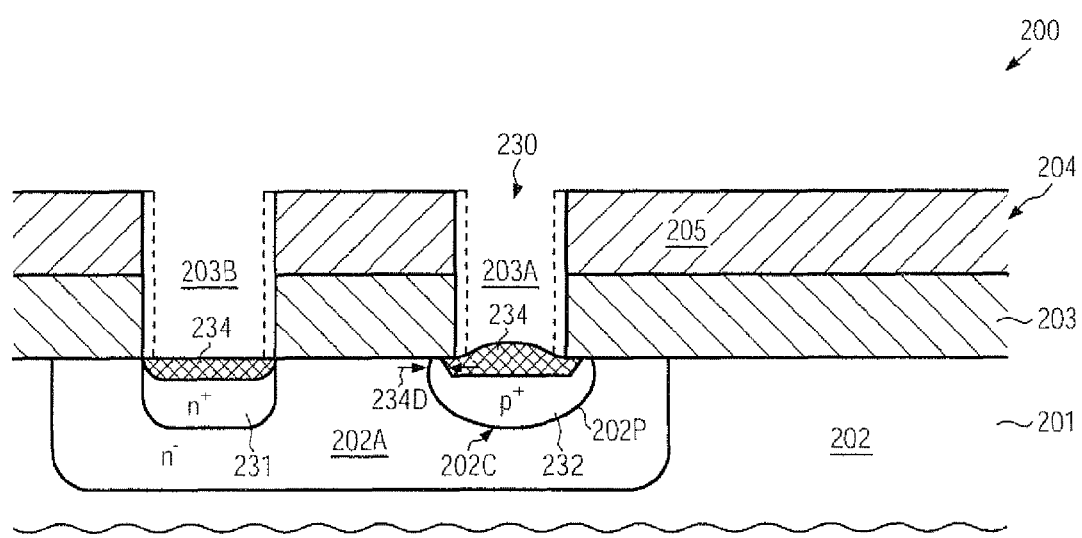
Figure 2H:
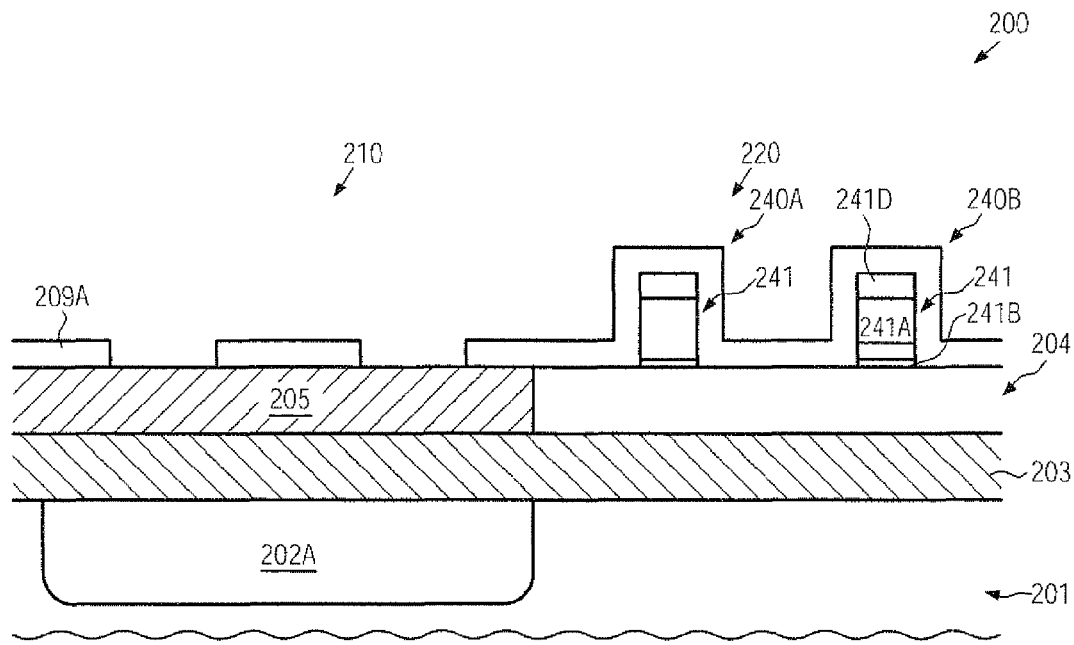
FIGS. 2h-2p schematically illustrate cross-sectional views of the semiconductor device according to still further illustrative embodiments in which the in situ doped semiconductor material for the PN junction of the substrate diode may be formed during a sequence for providing an embedded semiconductor alloy in a transistor in order to enhance performance of the transistor by inducing a strain in the channel region thereof.
Figure 2I:
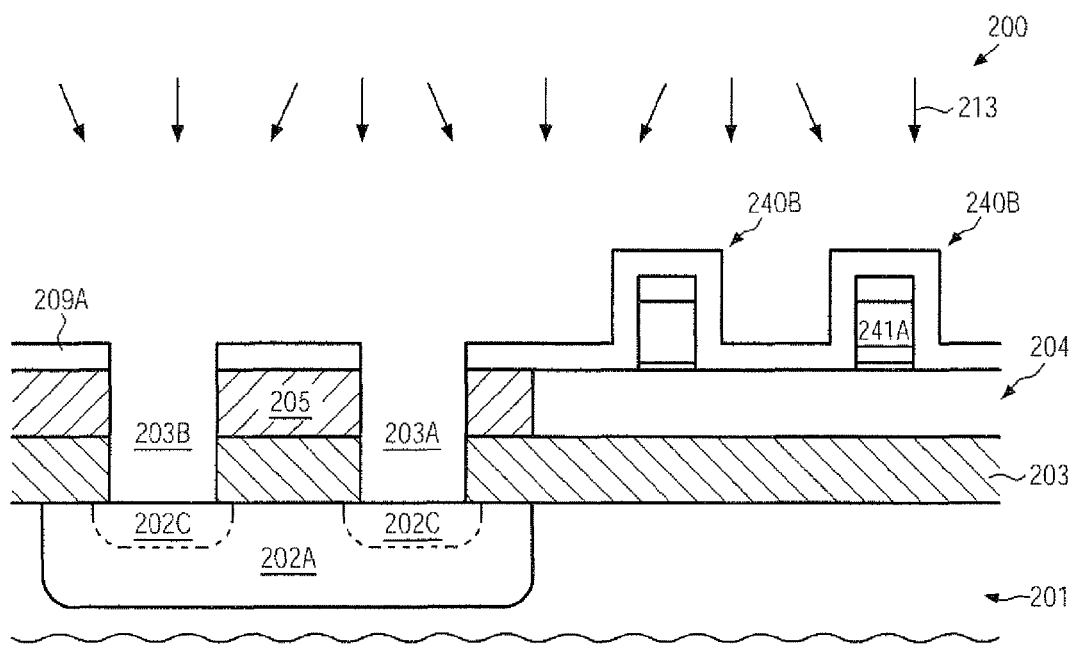
Figure 2J:
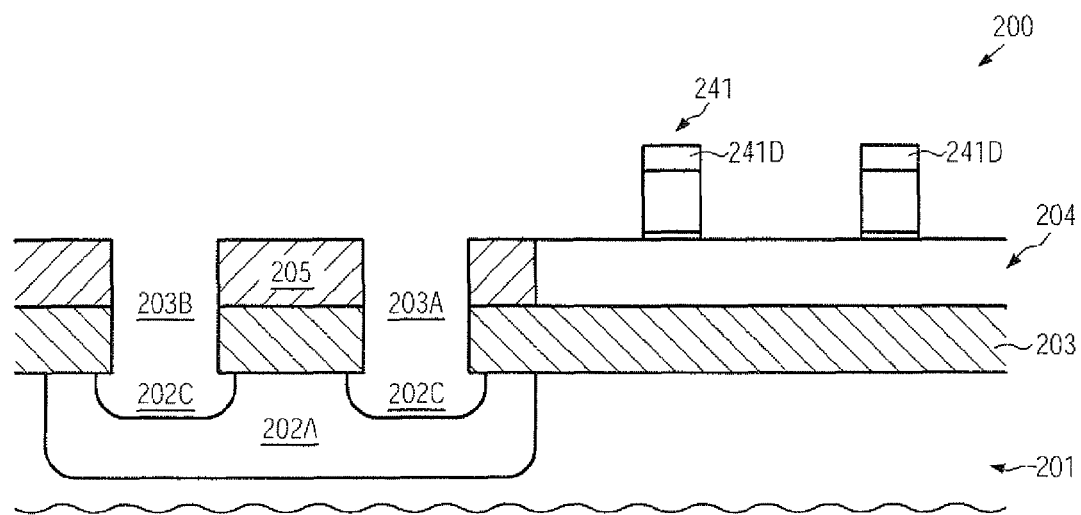
Figure 2K:
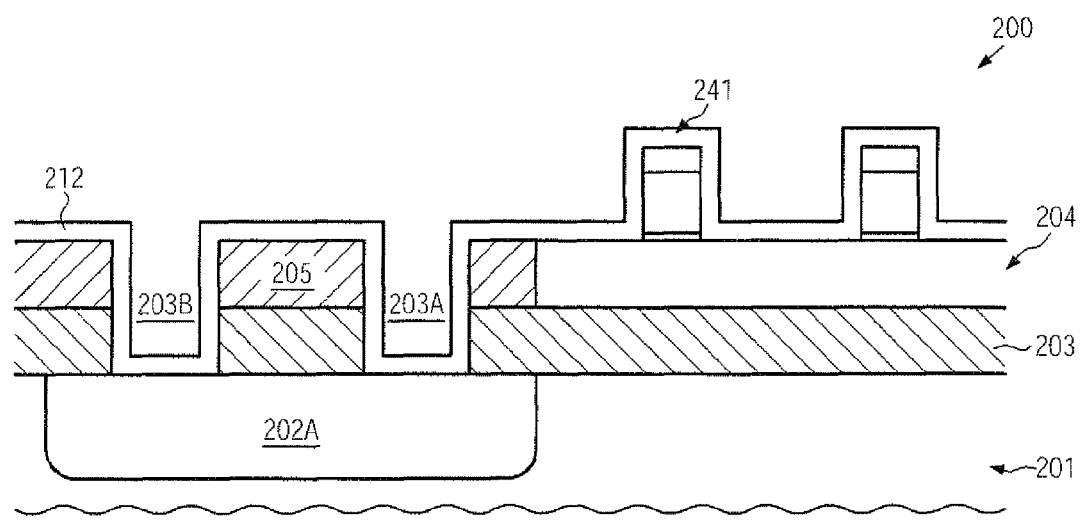
Figure 2L:
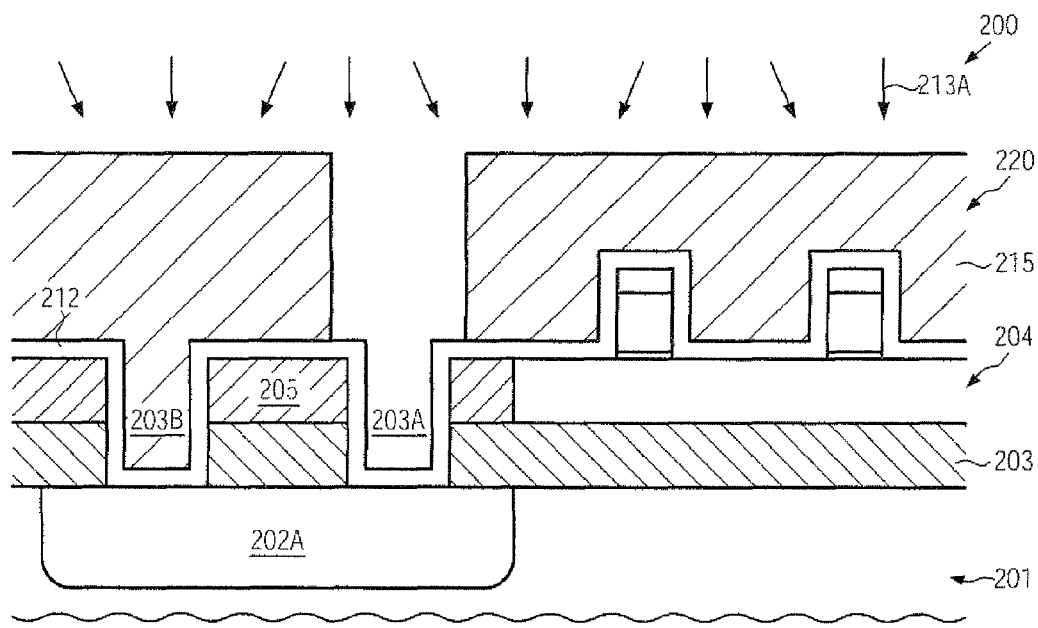
Figure 2M:
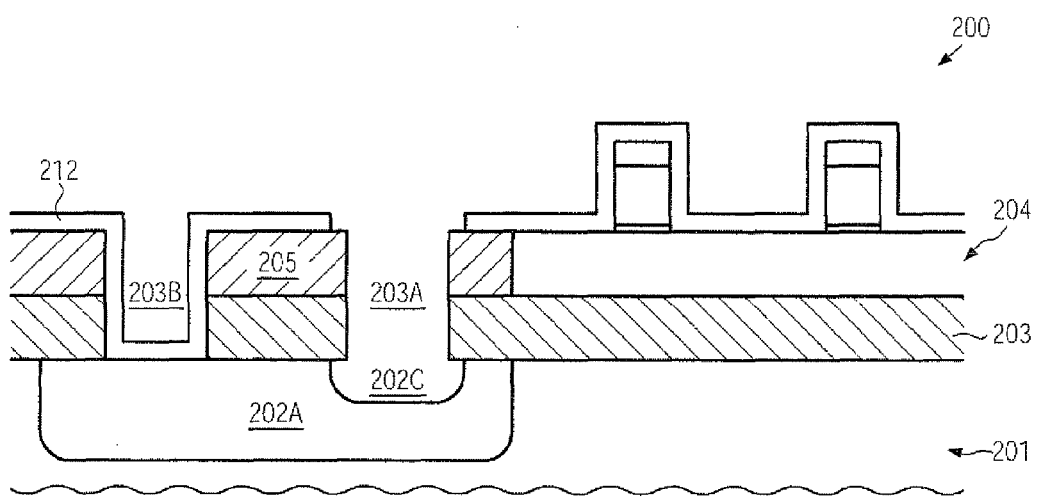
Figure 2N:
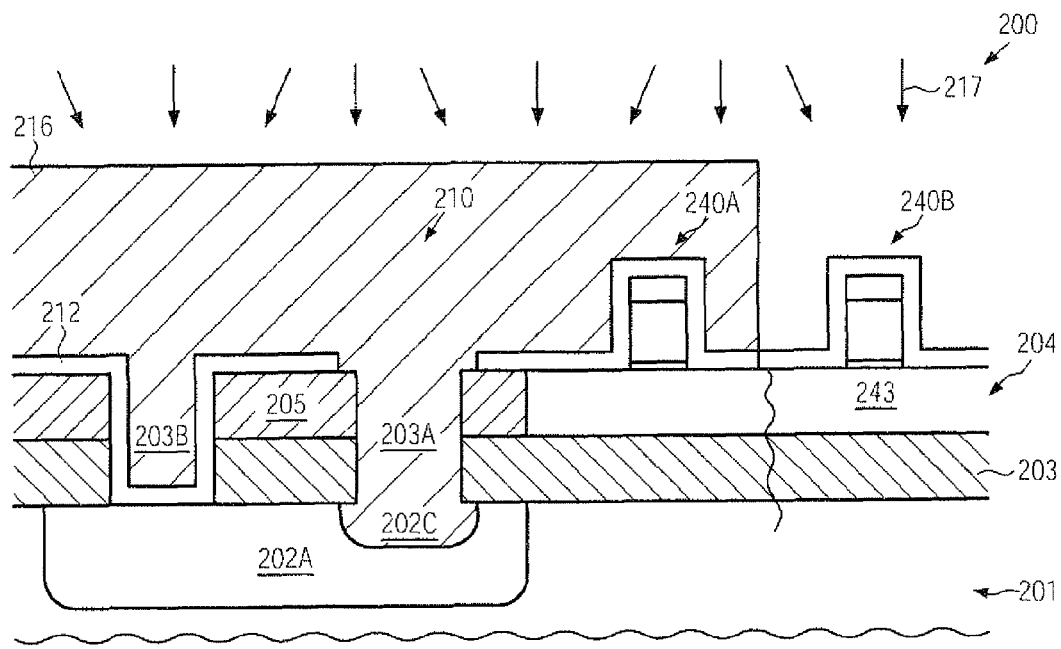
Figure 2O:
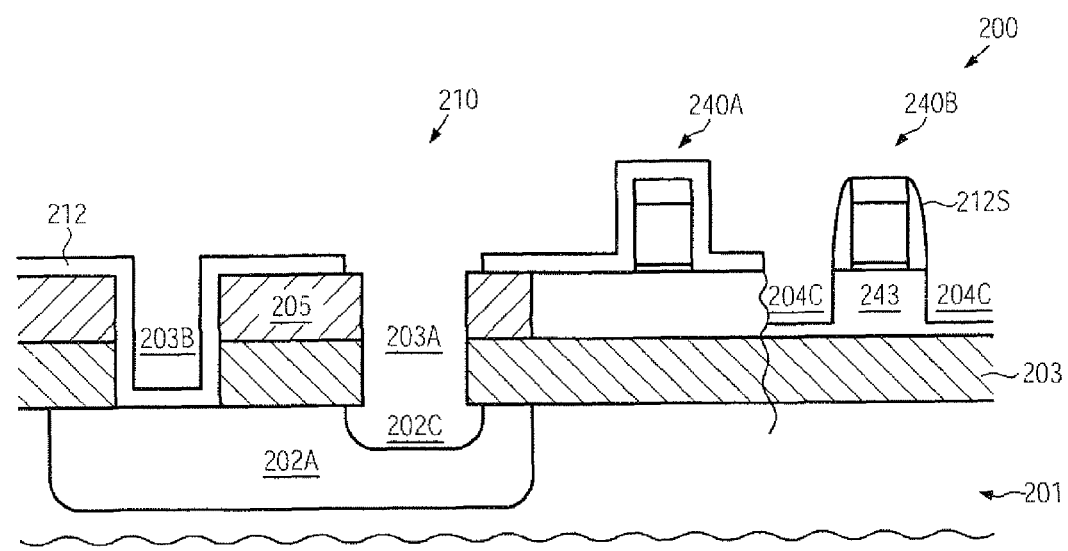
Figure 2P:
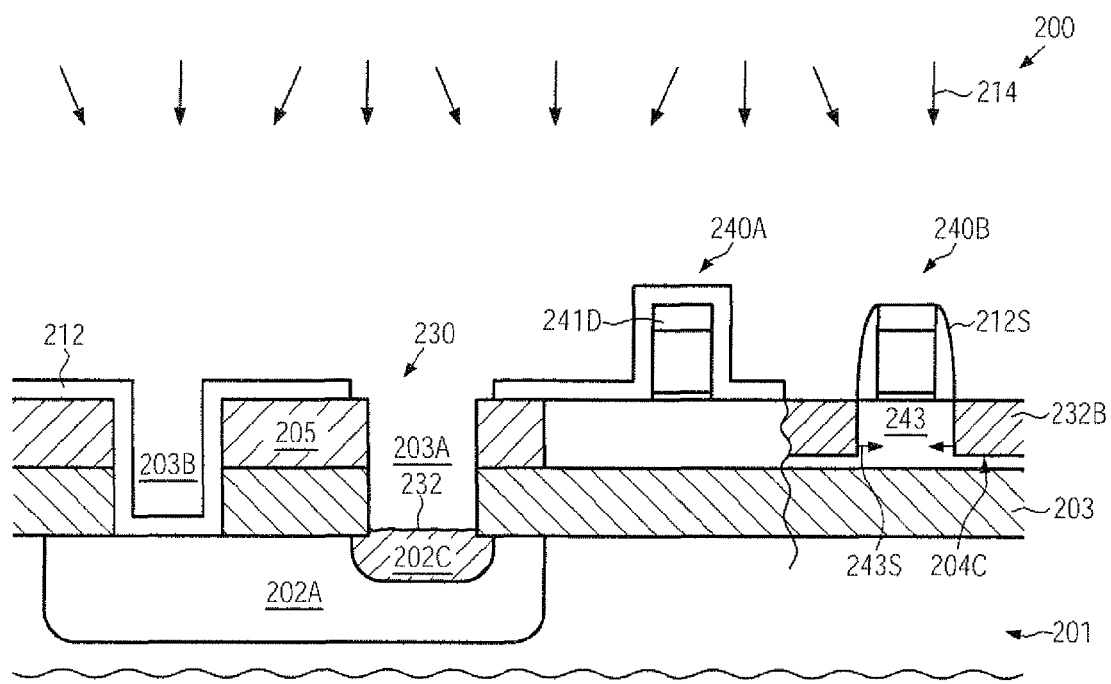

With reference to FIGS. 2a-2p, further illustrative embodiments will now be described in more detail, wherein reference may also be made to FIGS. 1a-1c, if required.

FIG. 2a schematically illustrates a cross-sectional view of a semiconductor device 200 comprising a substrate 201 with a crystalline substrate material 202. Furthermore, a buried insulating layer 203 may be formed on the crystalline substrate material 202, at least in some areas of the semiconductor device 200, in order to form an SOI configuration. As previously explained with reference to the semiconductor device 100, the crystalline substrate material 202 may have any appropriate dopant concentration in this manufacturing stage in accordance with overall device requirements. In the embodiment shown, a well region 202A, such as an N-doped region, may be formed in the material 202 in order to receive an appropriate PN junction for a circuit element, such as a substrate diode. Furthermore, the semiconductor device 200 may comprise a semiconductor layer 204, which may include an isolation structure 205 so as to laterally separate different device regions of the device 200. For example, in FIG. 2a, only the isolation structure 205 of the semiconductor layer 204 is illustrated, wherein it should be understood that a semiconductor material of the layer 204 may laterally extend between adjacent isolation structures, as is also described with reference to the semiconductor device 100 or as will be described later on in more detail. In other cases, the well region 202A may be formed below a semiconductor material of the layer 204 when considered appropriate for the overall configuration of the semiconductor device 200. Moreover, in the manufacturing stage shown, an etch mask 207 is formed above the semiconductor layer 204 and may be appropriately configured in order to define the lateral size and the position of openings still to be formed through the layer 204, for instance the isolation structure 205, and the buried insulating layer 203. The etch mask 207 may be provided in the form of any appropriate material, such as a dielectric material, a polysilicon material, a resist material or combinations thereof, as previously explained.

The semiconductor device 200 as illustrated in FIG. 2a may be formed on the basis of the following processes. The substrate 201 including the crystalline material 202, the buried insulating layer 203 and the semiconductor layer 204, including the isolation structure 205, may be formed on the basis of manufacturing techniques as previously described with reference to the semiconductor device 100. Furthermore, it should be appreciated that, in other device areas (not shown), other circuit elements, such as resistors, transistors and the like, may be provided according to a specific manufacturing technique. Similarly, these circuit elements may be in a manufacturing stage that is compatible with the further processing for forming a PN junction in the well region 202A, for instance gate electrodes of field effect transistors to be formed in other device areas.

Thus, after forming the N-well 202A and isolation structures in the layer 204, such as the isolation structure 205, and possibly after forming the circuit components, the etch mask 207 may be formed on the basis of deposition techniques in combination with appropriate lithography processes, wherein well-established techniques and recipes may be applied. Thereafter, an etch process 211 may be performed so as to etch through the layer 204, i.e., in the embodiment shown, through the isolation structure 205, and through the buried insulating layer 203. For this purpose, a plurality of well-established etch recipes are available, for instance, for silicon dioxide-based material, which may be etched selectively with respect to silicon, silicon nitride and the like.

FIG. 2b schematically illustrates the semiconductor device 200 in a further advanced manufacturing stage. As illustrated, openings 203A, 203B may be formed in the layers 203, 204 so as to connect to the well region 202A. Moreover, a mask layer 212, for instance provided in the form of a silicon nitride material and the like, may be provided so as to at least cover the well region 202A in the opening 203B. On the other hand, the mask layer 212 may expose at least a portion of the bottom of the opening 203A during the further processing. As illustrated, the mask layer 212 may also be formed on at least some horizontal surface areas of the semiconductor layer 204 and the isolation structure 205. It should be appreciated that, in other illustrative embodiments, the mask layer 212 may also be provided on sidewalls of the opening 203A, depending on the etch strategy used for patterning the mask layer 212. In this case, the additional width of corresponding sidewall spacers (not shown) may be taken into consideration by appropriately adjusting a lateral extension of a cavity to be formed in the well region 202A on the basis of the opening 203A.

The semiconductor device 200 as illustrated in FIG. 2b may be formed on the basis of the following processes. After the etch process 211 (FIG. 2a), the mask 207 may be removed, for instance by any appropriate removal process for removing the material of the mask 207 selectively with respect to the underlying materials. Thereafter, the mask layer 212 may be deposited, for instance by chemical vapor deposition (CVD) and the like, followed by a lithography step for providing a mask (not shown), such as a resist mask, in order to pattern the layer 212. For instance, isotropic etch techniques may be used when the material of the mask layer 212 is to be substantially completely removed from the opening 203A. For this purpose, a plurality of well-established etch recipes may be used. For instance, silicon nitride material may be efficiently removed on the basis of hot phosphoric acid without unduly consuming silicon dioxide material, silicon material and the like. In other cases, an anisotropic etch process may be used on the basis of well-established etch recipes, which may result in remaining sidewall spacers (not shown) within the opening 203A.

FIG. 2c schematically illustrates the semiconductor device 200 when exposed to an etch ambient 213. The etch ambient 213 may be established on the basis of a plasma-based ambient, a wet chemical ambient and the like, as long as a desired lateral etch rate may be obtained in order to form a cavity 202C, which may extend under the buried insulating layer 203 to a desired extent. For example, a plurality of chlorine-based or fluorine-based etch chemistries are available and may be used for the process 213. In other cases, wet chemical etch recipes, for instance on the basis of an appropriate base, such as potassium hydroxide and the like, may be used. As illustrated, during the etch process 213, the lateral etch rate, indicated by 213L, may be selected so that further material removal in the opening 203A, as indicated by 203R, which may occur during the further processing of the device 200, as previously explained with reference to the semiconductor device 100, may be appropriately taken into consideration. That is, a certain degree of under-etching 213D may be created during the formation of the cavity 202C so that a sufficient offset between a PN junction still to be formed in the cavity 202C and the opening 203A, even with the increased lateral size as indicated by 203R, is maintained so as to substantially decouple the resulting characteristics of the PN junction from a silicidation process.

FIG. 2d schematically illustrates the semiconductor device 200 in a further manufacturing stage in which the device 200 may be exposed to a deposition ambient 214 in order to at least partially fill the cavity 202C with an in situ doped semiconductor material. In one illustrative embodiment, the deposition ambient 214 may be established on the basis of process parameters that provide significant material deposition on exposed surface areas of the crystalline material 202A, while a deposition on dielectric surface areas is sufficiently suppressed. In this case, the deposition may also be referred to as a selective epitaxial growth process. For this purpose, a plurality of well-established deposition recipes are available and may be used. In the embodiment shown, a P-type dopant species may be incorporated so as to form a PN junction with the remaining portion of the well region 202A. It should be appreciated, however, that, in other illustrative embodiments, an N-type dopant species may be incorporated when required for forming a corresponding PN junction. Thus, during the deposition process 214, any appropriate semiconductor material, such as a silicon material, possibly in combination with other components such as germanium, carbon and the like, may be incorporated, wherein a specific amount of precursor gases may also be added to the ambient 214 so as to obtain a desired dopant concentration. The supply of a dopant including precursor gas to the deposition ambient 214 may also be referred to as in situ doping. During the deposition process 214, one or more process parameters may be varied in order to specifically design the resulting characteristic of a substrate diode. For example, the material composition of the semiconductor material to be filled into the cavity 202C may be appropriately adapted, while, in other cases, additionally or alternatively to changing the material composition, the concentration of the dopant species may also be varied. It should be appreciated that a variation of the dopant concentration may not be considered as changing the basic material composition since, typically, the concentration of dopant species may be one or more orders of magnitude less compared to the concentration of any materials. For instance, when forming a silicon/germanium alloy, the concentrations of the silicon species and the germanium species is significantly greater than the concentration of a dopant species, such as boron, even if a moderately high dopant concentration of $10^{20}$-$10^{22}$ cm$^2$ is desired at the corresponding PN junction.

FIG. 2e schematically illustrates the semiconductor device 200 with an in situ doped semiconductor material 232 formed in the cavity 202C and, in the embodiment shown, also extending into the opening 203A. In one illustrative embodiment, the semiconductor material 232 may comprise a silicon/germanium alloy with any appropriate concentration of germanium in order to obtain the desired diode characteristics, such as reduced leakage current and the like. Furthermore, a desired dopant concentration may be provided at and in the vicinity of a PN junction 202P, which may be controlled on the basis of controlling process parameters of the deposition process 214 (FIG. 2d), as discussed above. Consequently, the offset 213U, the region 232 and thus the PN junction 202P at the interface between the well region 202A and the buried insulating layer 203 is appropriately selected so as to reduce or substantially avoid negative impact of a silicidation process still to be performed, even if a further material removal in the opening 203A may occur, as indicated by 203R.

It should be appreciated that, in other illustrative embodiments, the in situ doped semiconductor material 232 may be comprised of other components, such as silicon carbide and the like, depending on desired diode characteristics.

FIG. 2f schematically illustrates the semiconductor device 200 according to further illustrative embodiments wherein the device 200 is exposed to a deposition ambient 214A after filling the cavity 202C to a certain degree with the material 232. It should be appreciated that any desired amount of material 232 may be formed in the cavity 202C prior to performing the deposition process 214A in order to form a cap layer 232A, which, for instance, may differ from the material 232 in at least one of dopant concentration, material composition and the like, in order to enhance the further processing of the device 200. In one illustrative embodiment, the cap layer 232A may have an increased concentration of silicon species compared to the material 232 in order to enhance a silicidation process and a resulting metal silicide, for instance with respect to stability and the like. For example, if the material 232 is provided in the form of a silicon/germanium material, the concentration may be significantly reduced in the cap layer 232A, for instance, for a concentration of approximately 15-30 atomic percent germanium to a reduced level of approximately 1-10 atomic percent. In still other illustrative embodiments, the cap layer 232A may be provided as a substantially "pure" silicon material except for dopant species and the like.

The deposition process 214A may represent a separate deposition step, for instance by forming the cap layer 232A with an appropriate thickness and material composition wherein, in some illustrative embodiments, an amount of the material 232A may be selected such that the layer 232A may be substantially completely consumed during the subsequent silicidation process. In other cases, the deposition process 214A may represent a final phase of a selective epitaxial growth process during which the material 232 may be formed in a preceding process phase.

FIG. 2g schematically illustrates the semiconductor device 200 in a further advanced manufacturing stage. As illustrated, a substrate diode 230 may comprise the in situ doped semiconductor material 232, thereby forming the PN junction 202P and an N-doped region 231. Furthermore, metal silicide regions 234 may be formed in the regions 232, 231, thereby providing a low contact resistance with respect to any contact elements that may still have to be formed in a later manufacturing stage when providing a contact level of the semiconductor device 200. As illustrated, the metal silicide region 234 formed in the in situ doped material 232 may have an offset 234D with respect to the PN junction 202P, although the lateral size of the opening 203A may have been increased during the preceding manufacturing sequence, for instance when performing wet chemical etch processes, as previously explained with reference to the semiconductor device 100. Consequently, the diode characteristic of the substrate diode 230 may be adjusted in a highly predictable manner irrespective of the material removal during the preceding wet chemical etch processes due to the offset 234D. Moreover, as previously discussed, the electronic characteristics of the material 232 itself may be selected in order to obtain the desired diode behavior. For example, low leakage behavior may be obtained by providing a silicon/germanium alloy, while at the same time the dopant gradient at the PN junction 202P may be adjusted on the basis of the degree of in situ doping of the material 232. On the other hand, the characteristics of the region 231 in combination with the associated metal silicide region 234 are not very critical since the region 231 may substantially act as a contact area for connecting to the PN junction 202P.

The semiconductor device 200 comprising the substrate diode 230 may be formed on the basis of the following processes. After providing the in situ doped semiconductor material 232, the mask 212 (FIG. 2f) may be removed at any appropriate manufacturing stage and the region 231 may be formed, for instance by ion implantation, possibly in combination with the formation of drain and source regions of N-type transistors in other device areas, as is, for instance, also explained above with reference to the semiconductor device 100. Thereafter the further processing may be continued by anneal processes in which a further diffusion of the PN junction 202P may occur which, however, may be taken into consideration when selecting an appropriate shape and size for the cavity 202C. Thereafter, wet chemical cleaning or etch processes may be performed so as to prepare the device 200 for the subsequent deposition of an appropriate refractory metal, thereby increasing the openings 203A, 203B, as previously explained. Subsequently, the metal may be deposited and may be heat treated to initiate a chemical reaction with a silicon species of exposed crystalline areas, such as the materials 232 and 231. The corresponding silicide formation may also be controlled by providing an appropriate material composition, at least in an upper portion of the material 232, for instance in the form of the cap layer as shown in FIG. 2f. Thus, the metal silicide 234 may be obtained in a highly reliable manner, substantially without affecting the overall behavior of the diode 230. Thereafter, the further processing may be continued by depositing an interlayer dielectric material and patterning the same so as to form contact elements (not shown) for connecting the regions 231, 232, respectively. For this purpose, any well-established process strategy may be applied.

As a consequence, the principles disclosed herein make for superior characteristics of the substrate diode 230 since undue close proximity of the metal silicide 234 to the PN junction 202P may be avoided, which may conventionally even result in a short-circuiting of the PN junction. This may be accomplished by avoiding an implantation step for providing a required dopant concentration.

With reference to FIGS. 2h-2p, further illustrative embodiments will now be described in which the formation of an in situ doped semiconductor material for substrate diodes may be correlated with the provision of an embedded strain-inducing semiconductor alloy in sophisticated transistor elements.

FIG. 2h schematically illustrates the semiconductor device 200 in which the substrate diode is to be formed in a first device region 210, while transistor elements 240A, 240B are to be formed in a second device region 220. In the manufacturing stage shown, the transistors 240A, 240B may comprise a gate electrode structure 241 including a gate electrode material 241a, a gate dielectric material 241B and a cap layer 241D. Moreover, an etch mask 209A may be formed so as to define the size and lateral position of openings to be formed in the layers 203 and 204, while covering the transistors 240A, 240B. For instance, the etch mask 209A may be provided in the form of a silicon nitride material and the like.

FIG. 2i schematically illustrates the semiconductor device 200 in a further advanced manufacturing stage. As illustrated, the openings 203A, 203B are formed in the layers 203 and 204, for instance in the isolation structure 205 in the embodiment shown, thereby exposing portions of the well region 202A. For this purpose, any appropriate anisotropic etch technique may be used, as previously explained. In the embodiment shown in FIG. 2i, the device 200 may be exposed to the etch ambient 213 in order to provide cavities 202C on the basis of the openings 203A, 203B. With respect to size and shape of the cavities 202C, the same criteria may apply as previously explained.

FIG. 2j schematically illustrates the semiconductor device 200 with the cavities 202C formed in the well region 202A and with the etch mask 209A (FIG. 2i) removed. The removal of the etch mask 209A may be accomplished on the basis of any appropriate etch recipe, depending on the material composition. For example, hot phosphoric acid may be efficiently used for a silicon nitride material. It should be appreciated that any other material and associated etch strategy may be applied. For example, the cap layers 241D of the gate electrode structures 241 may be provided in any appropriate form so as to avoid a complete removal during the preceding etch process for removing the etch mask 209A. Thereafter, the further processing may be continued as will be described with reference to FIG. 2k, wherein it should be appreciated that the presence of the cavity 202C below the opening 203B may not negatively affect the resulting substrate diode since this side of the substrate diode may merely act as a contact area.

In FIG. 2k, the semiconductor device 200 is illustrated in a stage corresponding to an initial stage as shown in FIG. 2i, wherein the etch process 213 for forming the cavities 202C may not be performed. Thus, at this stage, the mask layer 212 may be formed in a similar manner as previously described with reference to FIG. 2b. In embodiments according to FIG. 2j, the mask layer 212 may thus also be formed in the cavities 202C of FIG. 2j. With respect to any appropriate material and deposition techniques for the mask layer 212, the same criteria may apply as previously explained.

FIG. 2l schematically illustrates the semiconductor device 200 with an etch mask 215, which may expose the opening 203A while covering the opening 203B and also the device region 220. Thereafter, the etch sequence 213A may be performed so as to first remove the exposed portion of the mask layer 212 and subsequently etch into the material of the region 202A in order to form a cavity therein. For this purpose, the sequence 213A may be performed on the basis of well-established recipes, such as hot phosphoric acid for removing silicon nitride material selective to silicon dioxide material and subsequently any appropriate isotropic etch recipe for etching silicon material may be applied, as previously explained. It should be appreciated that the etch sequence 213A may also comprise an anisotropic process step for etching the mask layer 212, thereby possibly maintaining sidewall spacers within the opening 203A, the width of which may, however, be taken into consideration by appropriately increasing the lateral size of the corresponding cavity to be formed in the material 202A.

FIG. 2m schematically illustrates the semiconductor device 200 with the cavity 202C formed below the opening 203A, while the etch mask 215 (FIG. 2l) has been removed.

FIG. 2n schematically illustrates the semiconductor device 200 with a further etch mask 216 that may expose the transistor 240B while covering the transistor 240A and the device region 210. In the embodiment shown, it may be assumed that the transistor 240B may receive an embedded semiconductor alloy so as to enhance performance thereof, for instance, by inducing a desired magnitude and type of strain in a channel region 243 thereof. After forming the etch mask 216, for instance in the form of a resist mask and the like, an etch process 217 may be performed to first etch the mask layer 212 and subsequently etch into the semiconductor layer 204 in order to form corresponding cavities therein. For this purpose, well-established etch recipes may be applied.

FIG. 2o schematically illustrates the semiconductor device 200 after performing the above-described process sequence and after removing the etch mask 216 (FIG. 2n). As illustrated, the transistor 240B may comprise a sidewall spacer 212S that represents the remaining portion of the mask layer 212. Moreover, cavities 204C may be formed laterally adjacent to the channel region 243, which may be filled by an appropriate strain-inducing semiconductor material in a subsequent selective epitaxial growth process. Similarly, in the device region 210, the cavity 202C may be exposed after the removal of the etch mask 216, while a mask layer 212 is still formed within the opening 203B. In this manufacturing stage, the device 200 may be prepared for the selective deposition of the strain-inducing semiconductor alloy.

FIG. 2p schematically illustrates the semiconductor device 200 when exposed to the deposition ambient 214 for forming the in situ doped semiconductor material 232 in the cavity 202C. Similarly, during the process 214, a semiconductor material 232B, which may have substantially the same composition and in situ doping as the material 232, may be formed in the cavities 204C of the transistor 240B. The semiconductor material 232 and 232B is thus selected so that a corresponding mismatch of the natural lattice constant may be obtained with respect to the material of the layer 204C, thereby providing the material 232B in a strained state, which may thus result in a corresponding strain 243S in the channel region 243. It should be appreciated that the material 232 may also be grown in a corresponding strained state, depending on the crystallographic characteristics of the region 202A. For example, in some illustrative embodiments, the materials 232, 232B may be provided in the form of a silicon/germanium alloy with a germanium concentration of approximately 20 atomic percent and greater, such that the strain component 243S may result in a compression of the channel region 243, thereby enhancing hole mobility therein for a standard crystallographic configuration of a silicon-based material. It should be appreciated that the in situ doped nature of the material 232B may also result in a "pre-doping" of corresponding drain and source regions of the transistor 240B, wherein the dopant profile may be further modified by any implantation sequence, if considered appropriate. On the other hand, the dopant profile and concentration of the material 232 may be selected so as to obtain the desired diode characteristics for the substrate diode 230. Consequently, an enhanced characteristic of the substrate diode may be obtained and a performance enhancing mechanism may be implemented in the transistor 240B, which may be accomplished without requiring any additional selective epitaxial growth steps. Thus, a very efficient overall manufacturing flow may be obtained in embodiments in which a strain-inducing mechanism may have to be provided in at least one type of transistor. Thereafter, the further processing may be continued, for instance, by removing the mask layer 212 in combination with the sidewall spacer 212S, which may be accomplished on the basis of well-established etch techniques, such as wet chemical etch recipes using hot phosphoric acid, when the mask layer 212 is comprised of silicon nitride. Next, drain and source regions may be formed in the transistor 240A by ion implantation, as previously described, and, finally, metal silicide regions may be formed in the substrate diode and the transistors 240A, 240B, as previously explained.

As a result, the present disclosure provides semiconductor devices and techniques in which diode characteristics may be enhanced since the close proximity of a metal silicide to the PN junction may be avoided. Furthermore, the diode characteristics may be adjusted on the basis of an appropriate semiconductor material, such as a silicon/germanium material, and by adjusting an appropriate in situ dopant concentration. On the other hand, by providing a cap layer with desired material composition, specific process conditions for the metal silicide formation may be established, for instance, by providing a high silicon concentration, thereby also providing highly stable metal silicide materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming an opening through a buried insulating layer of said semiconductor device so as to expose a portion of a crystalline material of a substrate of said semiconductor device;
    forming a cavity in a portion of said crystalline material through said opening, said cavity having a greater lateral extension relative to said opening;
    forming a semiconductor material in said cavity, at least a portion of said semiconductor material comprising a dopant species so as to form a PN junction with said crystalline material; and
    forming a metal silicide on said semiconductor material.

2. The method of claim 1, wherein forming said cavity comprises performing a selective isotropic etch process and using said buried insulating layer as an etch mask.

3. The method of claim 1, wherein forming said semiconductor material in said cavity comprises performing a selective epitaxial growth process.

4. The method of claim 3, wherein forming said semiconductor material further comprises introducing a precursor material containing said dopant species into a deposition ambient of said selective epitaxial growth process at least for a certain time interval.

5. The method of claim 1, wherein said semiconductor material comprises silicon and at least one non-silicon species.

6. The method of claim 5, wherein said at least one non-silicon species is germanium.

7. The method of claim 5, wherein forming said semiconductor material comprises forming a cap layer as a last layer of said semiconductor material, wherein a concentration of said at least one non-silicon species in said cap layer is less than a concentration of said at least one non-silicon species outside of said cap layer.

8. The method of claim 7, wherein said metal silicide is formed in said cap layer.

9. The method of claim 1, further comprising forming a transistor element in and above a semiconductor layer formed on said buried insulating layer, wherein said transistor element comprises an embedded semiconductor alloy.

10. The method of claim 9, wherein said embedded semiconductor alloy and said semiconductor material formed in said cavity are formed by a selective epitaxial growth technique performed using the same precursor materials.

11. The method of claim 10, wherein said embedded semiconductor alloy and said semiconductor material are formed in a common selective epitaxial growth process.

12. A method of forming a substrate diode of a semiconductor device, said method comprising:
  forming an opening in a dielectric material formed on a crystalline substrate material of said semiconductor device;
  forming a cavity in said crystalline substrate material through said opening;
  filling at least a portion of said cavity with a doped semiconductor material comprised of a silicon/germanium containing semiconductor alloy;
  forming a metal silicide so as to electrically connect to said doped semiconductor material; and
  forming a transistor element in a semiconductor layer formed above said crystalline substrate material, wherein said transistor element comprises an embedded silicon/germanium alloy.

13. The method of claim 12, further comprising forming a cap layer on said doped semiconductor material, wherein a silicon concentration of said cap layer is greater than a silicon concentration in said doped semiconductor material.

14. The method of claim 13, wherein said metal silicide is formed in said cap layer.

15. The method of claim 12, wherein said doped semiconductor material and said embedded silicon/germanium alloy are formed by performing a common selective epitaxial growth process.

16. A semiconductor device, comprising:
  a first doped region laterally embedded in a crystalline substrate material and comprising a semiconductor alloy;
  a second doped region formed in said crystalline substrate material, said first and second doped regions forming a PN junction of a substrate diode;
  a metal silicide formed in a portion of said first doped region; and
  a buried insulating layer formed on said crystalline substrate material, said buried insulating layer comprising an opening extending to said metal silicide.

17. The semiconductor device of claim 16, wherein a lateral extension of said semiconductor alloy is greater than a lateral extension of said opening.

18. The semiconductor device of claim 16, wherein said semiconductor alloy comprises silicon and germanium.

19. The semiconductor device of claim 16, further comprising a cap layer formed on said semiconductor alloy, wherein a concentration of a non-silicon species in said cap layer is less than a concentration of said non-silicon species in said semiconductor alloy.

20. The semiconductor device of claim 16, further comprising a transistor formed in and above a semiconductor layer that is positioned above said buried insulating layer, wherein said transistor comprises an embedded semiconductor alloy.

21. The semiconductor device of claim 20, wherein said semiconductor alloy and said embedded semiconductor alloy comprises silicon and germanium.

22. The semiconductor device of claim 21, wherein said semiconductor alloy and said embedded semiconductor alloy have substantially the same material composition.

* * * * *